(12) United States Patent
Lee et al.

(10) Patent No.: US 6,946,851 B2
(45) Date of Patent: Sep. 20, 2005

(54) CARBON NANOTUBE ARRAY BASED SENSOR

(75) Inventors: Christopher L. Lee, Oakland, CA (US); Aleksandr Noy, Fremont, CA (US); Stephan P. Swierkowski, Livermore, CA (US); Karl A. Fisher, Brentwood, CA (US); Bruce W. Woods, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 133 days.

(21) Appl. No.: 10/611,136

(22) Filed: Jun. 30, 2003

(65) Prior Publication Data

US 2004/0004485 A1 Jan. 8, 2004

Related U.S. Application Data

(60) Provisional application No. 60/393,575, filed on Jul. 3, 2002.

(51) Int. Cl.[7] ........................... G01R 27/26; H01M 4/58
(52) U.S. Cl. ..................................... 324/658; 429/231.8
(58) Field of Search ................................ 324/658, 649, 324/600, 515, 519, 548, 661, 686, 242, 243, 207.13, 207.22; 429/31, 140, 164, 166, 231.8; 422/105, 107, 108, 112; 257/24, 76, 254; 73/1.46, 1.48, 1.82, 40.5 A, 570.5, 170.13, 861.18, 861.23, 861.25, 861.26

(56) References Cited

U.S. PATENT DOCUMENTS

| 6,123,819 | A | * | 9/2000 | Peeters ........................ 204/452 |
| 6,376,971 | B1 | | 4/2002 | Pelrine et al. |
| 6,445,006 | B1 | | 9/2002 | Brandes et al. |
| 6,668,628 | B2 | * | 12/2003 | Hantschel et al. ............. 73/105 |
| 6,809,462 | B2 | * | 10/2004 | Pelrine et al. ............... 310/319 |
| 6,841,302 | B2 | * | 1/2005 | Anglin et al. ................ 429/220 |
| 6,881,521 | B2 | * | 4/2005 | Yanagisawa et al. ..... 429/231.8 |
| 6,890,685 | B2 | * | 5/2005 | Yamamoto et al. ....... 429/218.1 |
| 2002/0117659 | A1 | | 8/2002 | Lieber et al. |
| 2002/0158342 | A1 | * | 10/2002 | Tuominen et al. ........... 257/784 |
| 2002/0159943 | A1 | * | 10/2002 | Smalley et al. ........... 423/447.1 |
| 2002/0192441 | A1 | * | 12/2002 | Kalkan et al. ............... 428/209 |
| 2003/0077515 | A1 | * | 4/2003 | Chen et al. ............... 429/231.8 |
| 2003/0119174 | A1 | * | 6/2003 | Han et al. ................. 435/287.1 |

* cited by examiner

Primary Examiner—Anjan Deb
Assistant Examiner—Hoai-An D. Nguyen
(74) Attorney, Agent, or Firm—Eddie E. Scott; Alan H. Thompson

(57) ABSTRACT

A sensor system comprising a first electrode with an array of carbon nanotubes and a second electrode. The first electrode with an array of carbon nanotubes and the second electrode are positioned to produce an air gap between the first electrode with an array of carbon nanotubes and the second electrode. A measuring device is provided for sensing changes in electrical capacitance between the first electrode with an array of carbon nanotubes and the second electrode.

40 Claims, 4 Drawing Sheets

CARBON NANOTUBE ARRAY BASED SENSOR

CROSS-REFERENCE TO RELATED APPLICATIONS

This application claims the benefit of U.S. Provisional Patent Application No. 60/393,575 filed Jul. 3, 2002 and titled "Carbon Nanotube Array Based Acoustic Sensor and Accelerometer." U.S. Provisional Patent Application No. 60/393,575 is incorporated herein by this reference.

The United States Government has rights in this invention pursuant to Contract No. W-7405-ENG-48 between the United States Department of Energy and the University of California for the operation of Lawrence Livermore National Laboratory.

BACKGROUND

1. Field of Endeavor

The present invention relates to carbon nanotubes and more particularly to a carbon nanotube array based sensor system.

2. State of Technology

U.S. Pat. No. 6,376,971 for electroactive polymer electrodes issued Apr. 23, 2002 to Ronald E. Pelrine, Roy D. Kornbluh, Qibing Pei, and Jose P. Joseph and assigned to SRI International provides the following state of technology information, "In many applications, it is desirable to convert from electrical energy to mechanical energy. Exemplary applications requiring translation from electrical to mechanical energy include robotics, pumps, speakers, general automation, disk drives and prosthetic devices. These applications include one or more actuators that convert electrical energy into mechanical work—on a macroscopic or microscopic level. Common electric actuator technologies, such as electromagnetic motors and solenoids, are not suitable for many of these applications, e.g., when the required device size is small (e.g., micro or mesoscale machines). These technologies are also not ideal when a large number of devices must be integrated into a single structure or under various performance conditions such as when high power density output is required at relatively low frequencies."

U.S. Pat. No. 6,445,006 for microelectronic and microelectromechanical devices comprising carbon nanotube components issued Sep. 3, 2002 to George R. Brandes and Xueping Xu and assigned to Advanced Technology Materials, Inc. provides the following state of technology information, "A microelectronic or microelectromechanical device, including a substrate and a carbon microfiber formed thereon, which may be employed as an electrical connector for the device or as a selectively translational component of a microelectromechanical (MEMS) device."

U.S. patent application No. 2002/0117659 by Charles M. Lieber, Hongkun Park, Qingqiao Wei, Yi Cui, and Wenjie Liang, assigned to William Marsh Rice University, for nanosensors, published Aug. 29, 2002, provides the following state of technology information, "Nanowires are ideally suited for efficient transport of charge carriers and excitons, and thus are expected to be critical building blocks for nanoscale electronics and optoelectronics. Studies of electrical transport in carbon nanotubes have led to the creation of field effect transistors, single electron transistors, and rectifying junctions."

SUMMARY

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The present invention provides a sensor system comprising a first electrode with an array of carbon nanotubes and a second electrode. The first electrode with an array of carbon nanotubes and the second electrode are positioned to produce an air gap between the first electrode with an array of carbon nanotubes and the second electrode. A measuring device is provided for sensing changes in electrical capacitance between the first electrode with an array of carbon nanotubes and the second electrode. The sensor system of the present invention can be used as the sensor for many different devices. Examples include the use of the system as a motion detector, as an accelerometer, as an acoustic sensor, and the use of the system for other types of transducers.

The invention is susceptible to modifications and alternative forms. Specific embodiments are shown by way of example. It is to be understood that the invention is not limited to the particular forms disclosed. The invention covers all modifications, equivalents, and alternatives falling within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF THE INVENTION

Figure 1:
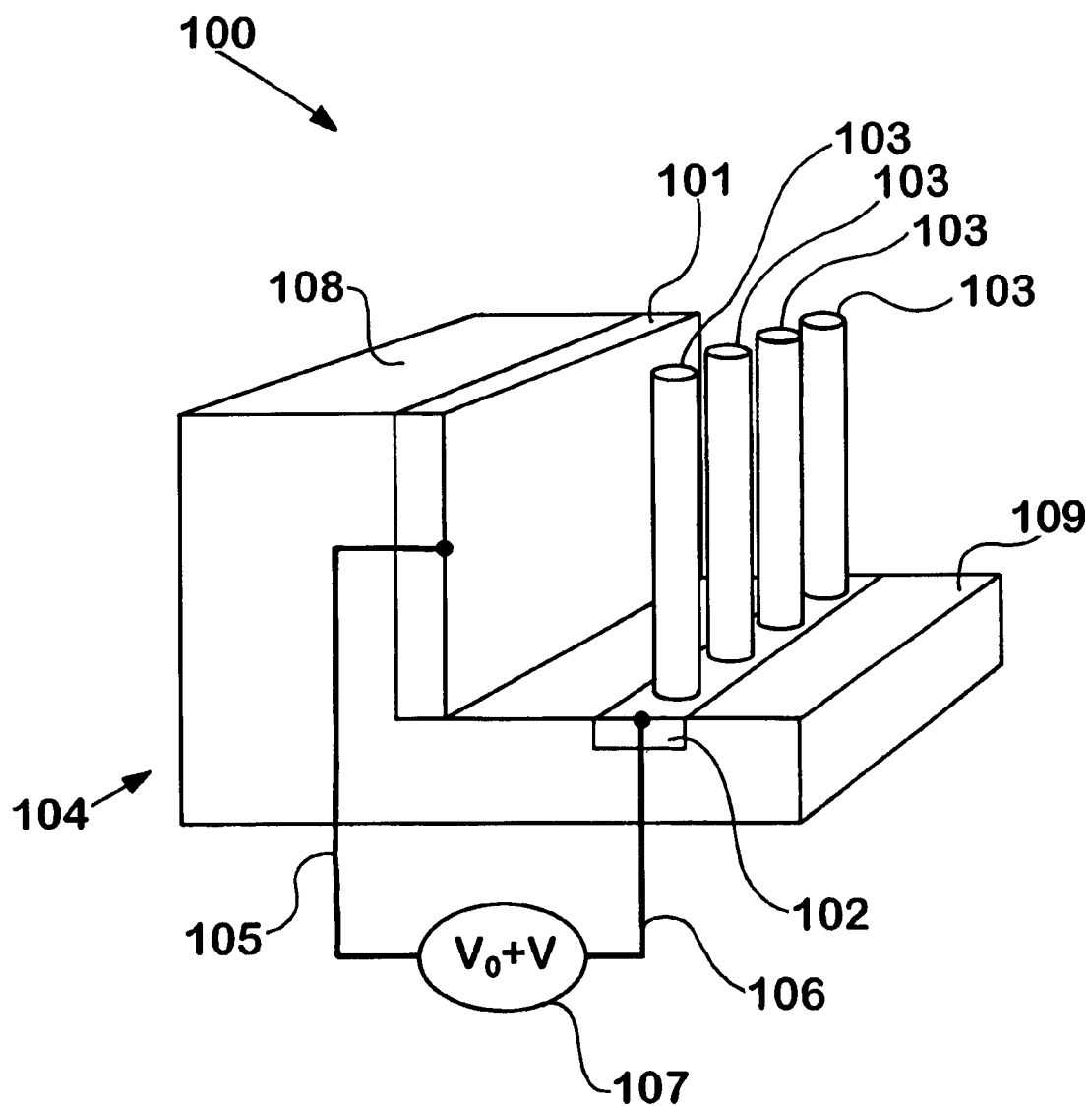
FIG. 1 illustrates an embodiment of an accelerometer constructed in accordance with the present invention.

Referring now to the drawings, to the following detailed description, and to incorporated materials; detailed information about the invention is provided including the description of specific embodiments. The detailed description serves to explain the principles of the invention. The invention is susceptible to modifications and alternative forms. The invention is not limited to the particular forms disclosed. The invention covers all modifications, equivalents, and alternatives falling within the spirit and scope of the invention as defined by the claims.

The present invention provides a sensor system comprising a first electrode with an array of carbon nanotubes, a second electrode, the first electrode with an array of carbon nanotubes and the second electrode positioned to produce an air gap between the first electrode with an array of carbon nanotubes and the second electrode, and a measuring device for sensing changes in electrical capacitance between the first electrode with an array of carbon nanotubes and the second electrode. Carbon nanotubes exhibit a unique combination of structural mechanical and electronic properties that have positioned them as one of the key building blocks of new nanoscale devices. Such devices are orders of magnitude smaller and more sensitive than micro-scale sensors allowing them to make measurements on much smaller length scales and with sensitivity unattainable with current state-of-the-art technology.

The present invention provides a system that utilizes aligned carbon nanotube arrays as the sensing element(s) in a micro-electronic transducer. The system of the present invention can be used as the sensor for many different devices. Examples include the use of the system as a motion detector, as an accelerometer, as an acoustic sensor, and the use of the system for other types of transducers.

Referring now to FIG. 1, an embodiment of an accelerometer constructed in accordance with the present invention is illustrated. The accelerometer is designated generally by the reference numeral 100. The structural elements of the accelerometer 100 include a first electrode 101 and a second electrode 102 positioned in an "L" shaped body 104. The first electrode 101 is located in the wall 108 of the body 104 and the second electrode 102 is positioned in base 109 of the body 104. As shown, the first electrode 101 and the second electrode 102 are at a 90° angle to each other.

Carbon nanotubes 103 extend from the second electrode 102. The carbon nanotubes 103 are located generally perpendicular to base 109 and generally parallel to the wall 108. Carbon nanotubes are fullerene-related structures which consist of graphene cylinders closed at either end with caps containing pentagonal rings. They were discovered in 1991 by the Japanese electron microscopist Sumio Iijima who was studying the material deposited on the cathode during the arc-evaporation synthesis of fullerenes. He found that the central core of the cathodic deposit contained a variety of closed graphitic structures including nanoparticles and nanotubes, of a type which had never previously been observed. A short time later, Thomas Ebbesen and Pulickel Ajayan, from Iijima's lab, showed how nanotubes could be produced in bulk quantities by varying the arc-evaporation conditions. The carbon nanotubes 103 are grown as a controllably-uniform carbon nanotube array of a predefined geometry on the patterned silicon electrode 102. The carbon nanotubes may be constructed according to various systems some of which will be described subsequently, some of which are known in the art, and some of which will be developed in the future.

The accelerometer 100 measures acceleration. Acceleration of the base 109 can be determined from changes in the capacitance of the nanotubes 103 relative to the wall 108. Movement of the base 109 either left or right in FIG. 1 causes the nanotubes 103 to accelerate relative to the wall 108. This acceleration can be sensed and measured by measuring Vo+V as indicated by the measuring device 107. The first electrode 101 is connected to measuring device 107 by the connection 105 and the second electrode 102 is connected to measuring device 107 by the connection 106. Movement in other directions can be determined by additional nanotube arrays similar to the nanotubes 103. The additional nanotube arrays are placed at other orientations.

The accelerometer 100 can be used for detecting and measuring motions in mechanical structures such as physics experiments, explosive environments, industrial machinery, bridges, automobiles, planes, missiles and other equipment. The accelerometer 100 provides results that are useful for determining forces, failures and failure prediction, and navigation, to name just a few of many applications.

The accelerometer 100 can be constructed using microfabrication technologies. Microfabricated devices are formed using crystalline substrates, such as silicon and gallium arsenide, but may be formed on non-crystalline materials, such as glass or certain polymers. The shapes of crystalline devices can be precisely controlled. Micromachined and etched surfaces and shapes are readily produced. The materials may be bonded by processes such as fusion at elevated temperatures, by anodic bonding, or by field-assisted methods. Microfabrication technology enables the production of electrical, mechanical, electromechanical, optical, chemical and thermal devices. The integration of these microfabricated devices into a single system allows for the batch production of microscale instruments.

Figure 2:
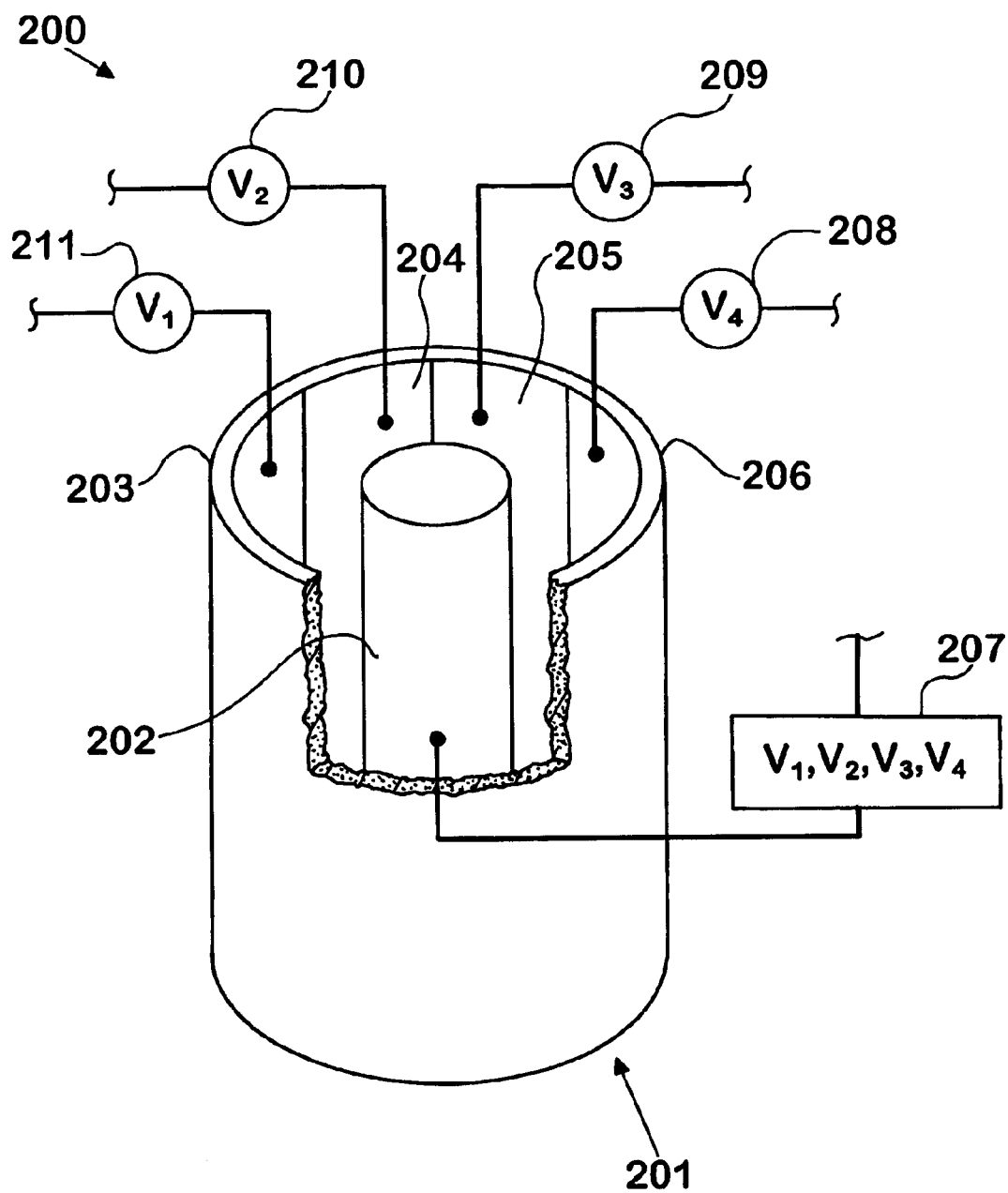
FIG. 2 illustrates another embodiment of an accelerometer constructed in accordance with the present invention.

Referring now to FIG. 2, another embodiment of an accelerometer constructed in accordance with the present invention is illustrated. This embodiment of an accelerometer is designated generally by the reference numeral 200. The accelerometer 200 is a directionally sensitive accelerometer. The accelerometer 200 will detect motion in two-dimensional plane. The accelerometer 200 can be oriented independently of gravity.

The accelerometer 200 comprises a cylindrical annular housing 201 and a cylindrical aligned inner electrode 202. Carbon nanotubes, similar to the carbon nanotubes 103 in FIG. 1, extend radially outward from the cylindrical inner electrode 202. The carbon nanotubes are grown as a controllably-uniform carbon nanotube array of a predefined geometry using catalytical chemical vapor deposition (CVD) process. The aligned carbon nanotubes are grown using a chemical vapor deposition process on the cylindrical inner electrode 202.

The cylindrical annular housing 201 is comprised of a multiplicity of individual electrodes 203, 204, 205, and 206. The accelerometer 200 measures acceleration. Acceleration of the nanotubes on the cylindrical inner electrode 202 can be determined from changes in capacitance relative to the electrodes 203, 204, 205, and 206. This acceleration can be measured by measuring $V_1$, $V_2$, $V_3$, $V_4$ as indicated by the measuring device 207. The accelerometer 200 is a directionally sensitive accelerometer. The accelerometer 200 will detect motion and measure acceleration in two-dimensional plane. The accelerometer 200 can be oriented independently of gravity. The electrode 203 is connected to measuring device 211. The electrode 204 is connected to measuring device 210. The electrode 205 is connected to measuring device 209. The electrode 206 is connected to measuring device 208. Movement in various orientations is determined by selective measurements between the aligned carbon nanotubes on the cylindrical inner electrode 202 and the appropriate individual electrodes 203, 204, 205, and 206.

The accelerometer 200 can be used for detecting and measuring motions in mechanical structures such as physics experiments, explosive environments, industrial machinery, bridges, automobiles, planes, missiles and other equipment. The accelerometer 200 provides results that are useful for determining forces, failures and failure prediction, and navigation, to name just a few of many applications.

The accelerometer 200 can be constructed using microfabrication technologies. Microfabricated devices are formed using crystalline substrates, such as silicon and gallium arsenide, but may be formed on non-crystalline materials, such as glass or certain polymers. The shapes of crystalline devices can be precisely controlled. Micromachined and etched surfaces and shapes are readily produced. The materials may be bonded by processes such as fusion at elevated temperatures, by anodic bonding, or by field-assisted methods. Microfabrication technology enables the production of electrical, mechanical, electromechanical, optical, chemical and thermal devices. The integration of these microfabricated devices into a single system allows for the batch production of microscale instruments.

Figure 3:
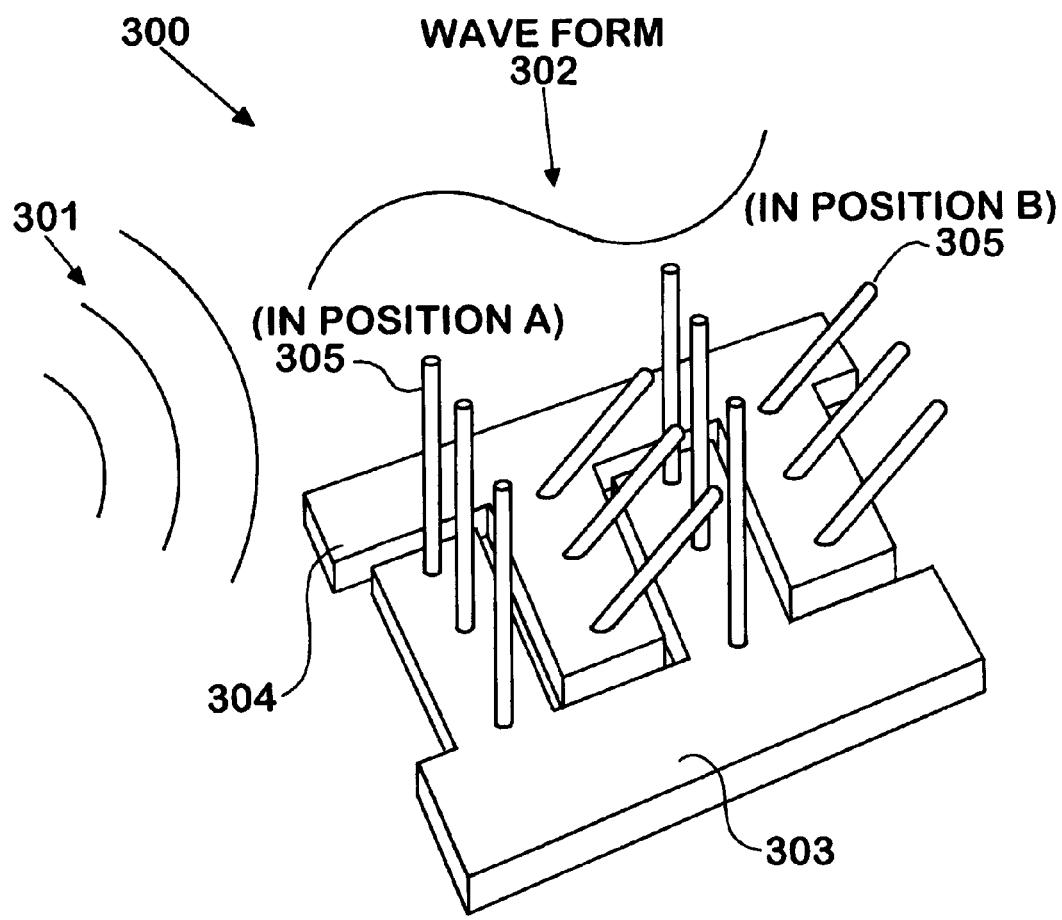
FIG. 3 illustrates another embodiment a nanotube array sensor system constructed in accordance with the present invention.

Referring now to FIG. 3, another embodiment a nanotube array sensor system constructed in accordance with the present invention is illustrated. This embodiment is designated generally by the reference numeral 300. The nanotube array sensor system 300 is grown on a pair of electrode surfaces as the central element of an acoustic sensor.

A first silicone electrode 303 and a second silicone electrode 304 are positioned in an interlocking comb arrangement. Carbon nanotubes 305 project from the first silicone electrode 303 and from the second silicone electrode 304. The carbon nanotubes 305 are normally located generally perpendicular to the electrodes as illustrated by the carbon nanotubes 305 shown in position A. As an incoming sound wave, represented as sound wave 301, passes over the nanotube array sensor system 300, the individual nanotubes 305 are deflected from the perpendicular position as illustrated by the carbon nanotubes 305 shown in position B. An electronic readout of this deflection allows the sound wave to be detected and measured. The electronic readout can be a capacitive circuit as illustrated in connection with the embodiments of the invention illustrated in FIGS. 1 and 2. The nanotube array sensor system 300 has the advantage of very high signal-to-noise ratio (averaged over the array) and also directional sensitivity with an appropriate geometry of the electrodes.

The nanotube array sensor system 300 is illustrated in FIG. 3 in a highly simplified and stylized illustration. The nanotube array sensor system 300 can be described as an aligned growth of nanotube "forests." Two adjacent "forests" at the first silicone electrode 303 and the second silicone electrode 304 are separated by an air gap. This serves as a capacitive gap due to the conductive properties of the carbon nanotubes. The motion of nanotubes resulting from incident acoustic waves will modulate the capacitance of the nanotube array sensor system 300 giving rise to the readout signal.

The nanotube array sensor system 300 provides an acoustic detector. Such an acoustic detector is the basis for an artificial human cochlea/ear. The working principle behind this artificial ear follows that of the stereocilla in the human cochlea. Stereocilla are the hairs that line the walls of the cochlea. When an acoustic or pressure wave impinges upon the hairs, their motion is translated into a signal sent through the nervous system. The signal takes the form of a voltage or current time-series that contains the complete frequency content of the sound that the acoustic detector "hears." Built-in electronics translate this time series into a form that the nervous system can interpret. An array of nanotubes in a similar configuration has a strong directional sensitivity and a high signal-to-noise ratio. The small size of the array facilitates detection of motion on the nanometer length scale.

Figure 4:
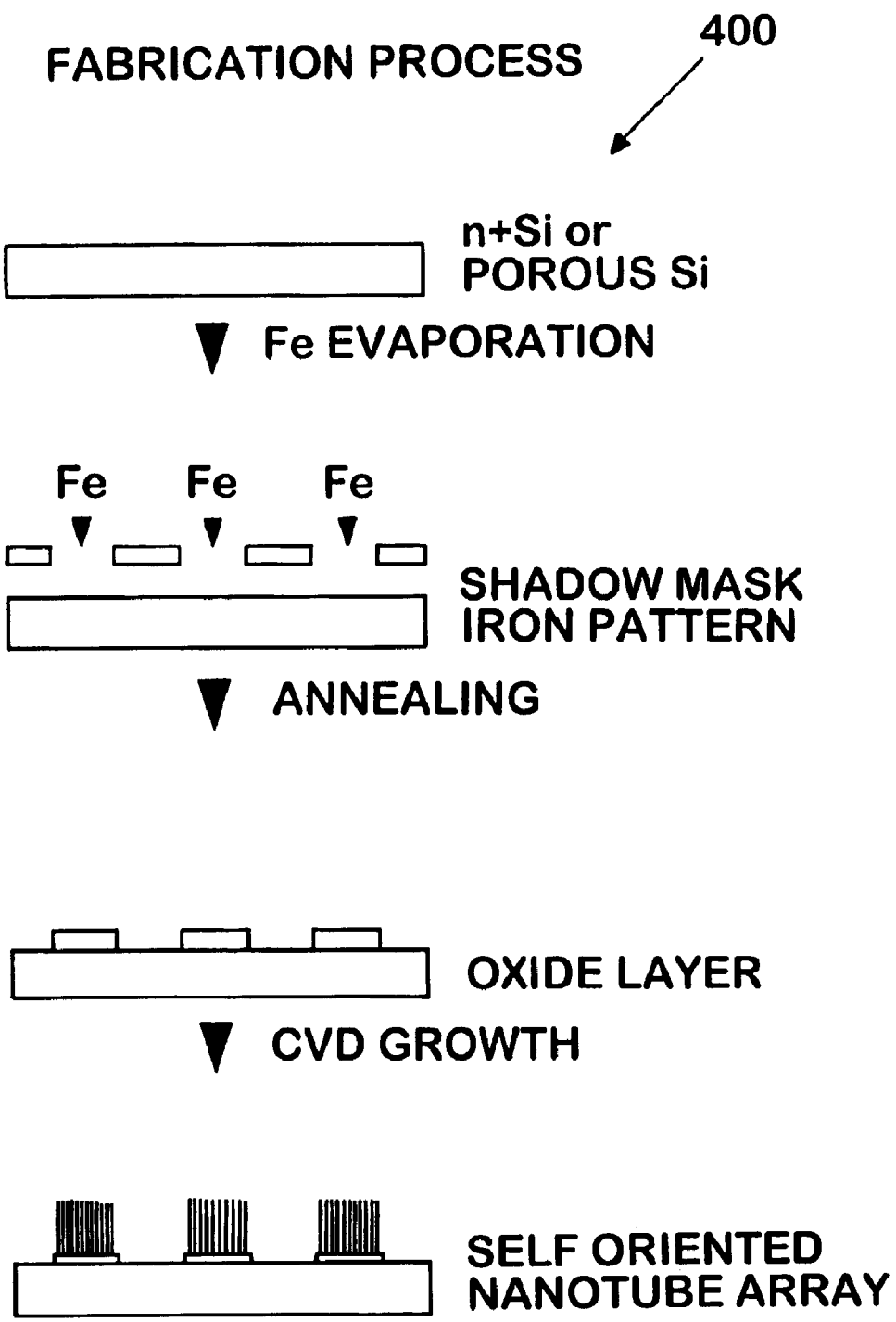
FIG. 4 illustrates an embodiment of a system for fabricating a nanotube array sensor system.

Referring now to FIG. 4, an embodiment of a method for fabricating a nanotube array sensor system is illustrated. The method for fabricating a nanotube array sensor system is designated generally by the reference numeral 400. A pair of comb electrodes are fabricated using a lithography process. A catalytical chemical vapor deposition (CVD) process is used wherein nanotubes are grown from nucleation sites of a Fe catalyst in a carbon based gas environment at high temperature.

The carbon nanotubes are grown on the electrodes using a catalytic CVD process. In the initial step n+Si or porous Si is provided. Fe is evaporated using a shadow mask iron pattern. The next step is annealing. This provides an oxide layer. The next step is CVD growth producing a self-oriented nanotube array. The method for fabricating a nanotube array sensor system 400 provides a controllably uniform array of carbon nanotubes aligned generally perpendicular to the surface of a series of silicon and silicon nitride surfaces (both membrane and features) of various geometries. Placement of the arrays on these types of surfaces is the first step in developing a signal read-out system. The surfaces are fabricated using standard lithography procedures. A catalyst is deposited onto the surfaces using electrophoretic deposition or microcontact printing. The process parameters include: substrate: Si, glass, S'02; catalyst: Fe, Ni; gas composition: ethylene, acetylene; temperature: 660–1000° C.; flow rate; and synthesis time. An annealing step uses porous Si substrate as growth guide. Hydrodynamic orientation in flow effects growth.

The nanotubes are generally aligned perpendicular to the surfaces by placing them into a highly directional electric field during their growth period. An electric field can be generated so that the field lines are perpendicular to the surface on which the nanotubes are to be grown. During growth, the axial direction of the nanotubes align with the electric field resulting in a field of nanotubes which are perpendicular to the electrode surface.

Simultaneously, the same growth and alignment procedure is used to produce a nanotube array on non-flat ceramic or metal surfaces. The nanotube array sensor system is grown on the pair of electrode surfaces and used as the central element of a sensor system. The deflection of the nanotubes resulting from an imposed external excitation, such as an acoustic wave, motion, air flow, etc., is mechanically, electronically, and/or optically) measured.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A sensor system, comprising:

a first electrode with an array of carbon nanotubes, said array of carbon nanotubes including a multiplicity of individual carbon nanotubes, a second electrode, said first electrode with an array of carbon nanotubes and said second electrode positioned to produce an air gap between said first electrode with an array of carbon nanotubes and said second electrode, and said first electrode with an array of carbon nanotubes and said second electrode positioned so that said individual carbon nanotubes do not contact said second electrode, and means for sensing changes in electrical capacitance between said first electrode with an array of carbon nanotubes and said second electrode.

2. The sensor system of claim 1, wherein said means for sensing changes in electrical capacitance comprises means for measuring changes in the electrical capacitance across said air gap.

3. The sensor system of claim 1, wherein said means for sensing changes in electrical capacitance senses movement in said array of carbon nanotubes.

4. The sensor system of claim 1, wherein said means for sensing changes in electrical capacitance senses movement in said carbon nanotubes.

5. The sensor system of claim 1, wherein said sensor senses motion by said means for sensing changes in electrical capacitance sensing movement in said array of carbon nanotubes.

6. The sensor system of claim 1, wherein said sensor senses acceleration by said means for sensing changes in electrical capacitance sensing acceleration in said array of carbon nanotubes.

7. A sensor system, comprising:
a first electrode with
an array of carbon nanotubes,
a second electrode, said first electrode with an array of carbon nanotubes and said second electrode positioned to produce an air gap between said first electrode with an array of carbon nanotubes and said second electrode, and
means for sensing changes in electrical capacitance between said first electrode with an array of carbon nanotubes and said second electrode, wherein said sensor senses sound by said means for sensing changes in electrical capacitance sensing movement in said array of carbon nanotubes caused by said sound.

8. A sensor system, comprising:
a first electrode with
an array of carbon nanotubes,
a second electrode, said first electrode with an array of carbon nanotubes and said second electrode positioned to produce an air gap between said first electrode with an array of carbon nanotubes and said second electrode, and
means for sensing changes in electrical capacitance between said first electrode with an array of carbon nanotubes and said second electrode, wherein said sensor senses sound by said means for sensing changes in electrical capacitance sensing movement in said array of carbon nanotubes caused by sound waves.

9. The sensor system of claim 8, wherein said sensor senses flow by said means for sensing changes in electrical capacitance sensing movement in said array of carbon nanotubes caused by said flow.

10. The sensor system of claim 8, wherein said first electrode with an array of carbon nanotubes and said second electrode are positioned in an "L" shaped body.

11. A sensor system, comprising:
a first electrode with
an array of carbon nanotubes,
a second electrode, said first electrode with an array of carbon nanotubes and said second electrode positioned to produce an air gap between said first electrode with an array of carbon nanotubes and said second electrode, and
means for sensing changes in electrical capacitance between said first electrode with an array of carbon nanotubes and said second electrode, wherein said first electrode with an array of carbon nanotubes and said second electrode are positioned in an "L" shaped body and wherein said "L" shaped body includes a base and a wall and wherein said first electrode with an array of carbon nanotubes is located in said base and said second electrode is positioned in said wall.

12. The sensor system of claim 11, wherein said first electrode with an array of carbon nanotubes and said second electrode are at a 90° angle to each other.

13. The sensor system of claim 12, wherein said means for sensing changes in electrical capacitance measures movement of said base.

14. A sensor system, comprising:
a first electrode with
an array of carbon nanotubes,
a second electrode, said first electrode with an array of carbon nanotubes and said second electrode positioned to produce an air gap between said first electrode with an array of carbon nanotubes and said second electrode, and
means for sensing changes in electrical capacitance between said first electrode with an array of carbon nanotubes and said second electrode, wherein said first electrode with an array of carbon nanotubes and said second electrode are positioned in concentric cylinders.

15. The sensor system of claim 14, wherein said concentric cylinders include an inner cylinder and an outer cylinder surrounding at least a portion of said inner cylinder.

16. The sensor system of claim 15, wherein said first electrode with an array of carbon nanotubes is located in inner cylinder and said second electrode is located in said outer cylinder.

17. The sensor system of claim 14, including a second array of carbon nanotubes on said second electrode.

18. The sensor system of claim 17, wherein said array of carbon nanotubes and said second array of carbon nanotubes are positioned adjacent and generally aligned with each other.

19. The sensor system of claim 18, wherein said sensor senses sound by said means for sensing changes in electrical capacitance senses relative movement in said array of carbon nanotubes and said second array of carbon nanotubes.

20. The sensor system of claim 19, wherein said sensor senses sound by said means for sensing changes in electrical capacitance senses relative movement in said array of carbon nanotubes and said second array of carbon nanotubes caused by said sound waves.

21. A method of producing a sensor, comprising the steps of:
providing a first electrode,
producing an array of carbon nanotubes that includes a multiplicity of individual nanotubes extending from said first electrode,
providing a second electrode,
positioning said first electrode with said array of carbon nanotubes and said second electrode in a position where there is an air gap between first electrode with said array of carbon nanotubes and said second electrode,
positioning said first electrode with said array of carbon nanotubes and said second electrode in a position where said individual carbon nanotubes will not contact said second electrode, and
providing a system for sensing changes in electrical capacitance between said first electrode with said array of carbon nanotubes and said second electrode.

22. The method of claim 21, wherein said means for sensing changes in electrical capacitance comprises means for measuring changes in the electrical capacitance across said air gap.

23. The method of claim 22, wherein said means for sensing changes in electrical capacitance senses movement in said array of carbon nanotubes.

24. The method of claim 21, wherein said means for sensing changes in electrical capacitance senses movement in said carbon nanotubes.

25. The method of claim 21, wherein said sensor senses motion by said means for sensing changes in electrical capacitance sensing movement in said array of carbon nanotubes.

26. The method of claim 21, wherein said sensor senses acceleration by said means for sensing changes in electrical capacitance sensing acceleration in said array of carbon nanotubes.

27. A method of producing a sensor, comprising the steps of:
providing a first electrode,
producing an array of carbon nanotubes extending from said first electrode;
providing a second electrode,
positioning said first electrode with said array of carbon nanotubes and said second electrode in a position where there is an air gap between first electrode with said array of carbon nanotubes and said second electrode, and
providing a system for sensing changes in electrical capacitance between said first electrode with said array of carbon nanotubes and said second electrode, wherein said sensor senses sound by said means for sensing changes in electrical capacitance sensing movement in said array of carbon nanotubes caused by said sound.

28. A method of producing a sensor, comprising the steps of:
providing a first electrode,
producing an array of carbon nanotubes extending from said first electrode,
providing a second electrode,
positioning said first electrode with said array of carbon nanotubes and said second electrode in a position where there is an air gap between first electrode with said array of carbon nanotubes and said second electrode, and
providing a system for sensing changes in electrical capacitance between said first electrode with said array of carbon nanotubes and said second electrode, wherein said sensor senses sound by said means for sensing changes in electrical capacitance sensing movement in said array of carbon nanotubes caused by sound waves.

29. The method of claim 28, wherein said sensor senses flow by said means for sensing changes in electrical capacitance sensing movement in said array of carbon nanotubes caused by said flow.

30. The method of claim 28, wherein said first electrode with an array of carbon nanotubes and said second electrode are positioned in an "L" shaped body.

31. A method of producing a sensor, comprising the steps of:
providing a first electrode,
producing an array of carbon nanotubes extending from said first electrode,
providing a second electrode,
positioning said first electrode with said array of carbon nanotubes and said second electrode in a position where there is an air gap between first electrode with said array of carbon nanotubes and said second electrode, and
providing a system for sensing changes in electrical capacitance between said first electrode with said array of carbon nanotubes and said second electrode, wherein said first electrode with an array of carbon nanotubes and said second electrode are positioned in an "L" shaped body and wherein said "L" shaped body includes a base and a wall and wherein said first electrode with an array of carbon nanotubes is located in said base and said second electrode is positioned in said wall.

32. The method of claim 31, wherein said first electrode with an array of carbon nanotubes and said second electrode are at a 90° angle to each other.

33. The method of claim 32, wherein said means for sensing changes in electrical capacitance measures movement of said base.

34. The method of claim 31, wherein said first electrode with an array of carbon nanotubes and said second electrode are positioned in concentric cylinders.

35. The method of claim 34, wherein said concentric cylinders include an inner cylinder and an outer cylinder surrounding at least a portion of said inner cylinder.

36. The method of claim 35, wherein said first electrode with an array of carbon nanotubes is located in inner cylinder and said second electrode is located in said outer cylinder.

37. The method of claim 31, including a second array of carbon nanotubes on said second electrode.

38. The method of claim 37, wherein said array of carbon nanotubes and said second array of carbon nanotubes are positioned adjacent and generally aligned with each other.

39. The method of claim 38, wherein said sensor senses sound by said means for sensing changes in electrical capacitance senses relative movement in said array of carbon nanotubes and said second array of carbon nanotubes.

40. The method of claim 39, wherein said sensor senses sound by said means for sensing changes in electrical capacitance senses relative movement in said array of carbon nanotubes and said second array of carbon nanotubes caused by said sound waves.

* * * * *